United States Patent
Iino et al.

(10) Patent No.: US 6,777,967 B2
(45) Date of Patent: Aug. 17, 2004

(54) INSPECTION METHOD AND INSPECTION APPARATUS

(75) Inventors: Shinji Iino, Nirasaki (JP); Kiyoshi Takekoshi, Nirasaki (JP); Tadatomo Suga, Tokyo (JP); Toshihiro Itoh, Chiba (JP); Kenichi Kataoka, Tokyo (JP)

(73) Assignees: Tokyo Electron Limited, Tokyo (JP); Tadatomo Suga, Tokyo (JP); Toshihiro Itoh, Chiba (JP)

( * ) Notice: Subject to any disclaimer, the term of this patent is extended or adjusted under 35 U.S.C. 154(b) by 39 days.

(21) Appl. No.: 09/931,888

(22) Filed: Aug. 20, 2001

(65) Prior Publication Data

US 2002/0021142 A1 Feb. 21, 2002

(30) Foreign Application Priority Data

Aug. 21, 2000 (JP) ........................... 2000-249702
Mar. 28, 2001 (JP) ........................... 2001-093303

(51) Int. Cl.[7] ................... G01R 31/02; G01R 31/26
(52) U.S. Cl. ........................... 324/757; 324/756
(58) Field of Search ................... 324/756–757, 324/765, 609

(56) References Cited

U.S. PATENT DOCUMENTS

| 4,477,774 A | * | 10/1984 | Revirieux | ................... 324/537 |
| 4,851,707 A | | 7/1989 | Lindsay | |
| 5,258,654 A | | 11/1993 | Roberts et al. | |
| 5,523,633 A | | 6/1996 | Imaizumi et al. | |
| 5,773,987 A | | 6/1998 | Montoya | |
| 5,936,419 A | * | 8/1999 | Chen | ................... 324/756 |
| 6,057,694 A | * | 5/2000 | Matsudo | ................... 324/757 |

FOREIGN PATENT DOCUMENTS

| JP | 64-048038 | * | 2/1989 |
| JP | 11-242062 | | 9/1999 |

OTHER PUBLICATIONS

Mark Beiley, et al. "A Micromachined Array Probe Card–Characterization" IEEE Transactions on Components, Packaging, and Manufacturing Technology–Part B, vol. 18, No. 1, Feb., 1995 pp. 184–191.

* cited by examiner

Primary Examiner—Evan Pert
Assistant Examiner—Paresh Patel
(74) Attorney, Agent, or Firm—Oblon, Spivak, McClelland, Maier & Neustadt, P.C.

(57) ABSTRACT

Disclosed is an inspection method for inspecting the electrical characteristics of a device by bringing an inspecting probe into electrical contact with an inspection electrode. An insulating film formed on the surface of the inspection electrode is broken by utilizing a fritting phenomenon so as to bring the inspection electrode into electrical contact with the inspection electrode.

3 Claims, 12 Drawing Sheets

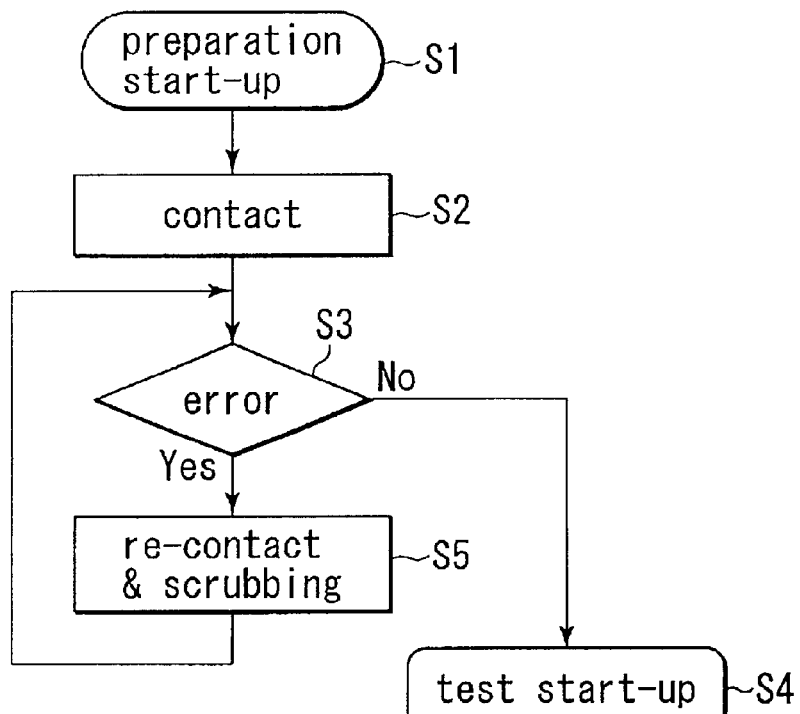
FIG. 21
(PRIOR ART)
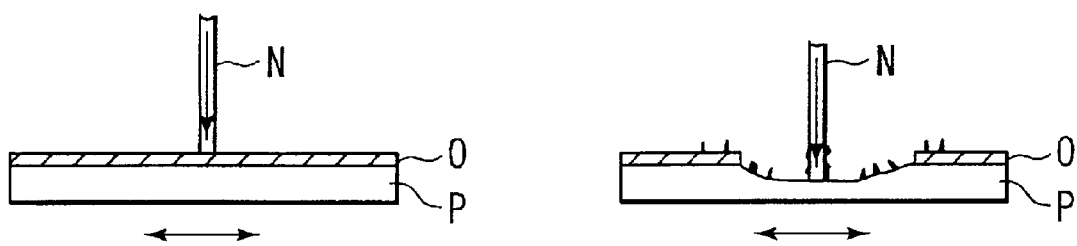
FIG. 22A
(RELATED ART)
FIG. 22B
(RELATED ART)

INSPECTION METHOD AND INSPECTION APPARATUS

CROSS-REFERENCE TO RELATED APPLICATIONS

This application is based upon and claims the benefit of priority from the prior Japanese Patent Applications No. 2000-249702, filed Aug. 21, 2000; and No. 2001-093303, filed Mar. 28, 2001, the entire contents of both of which are incorporated herein by reference.

BACKGROUND OF THE INVENTION

1. Field of the Invention

The present invention relates to an inspection method and an inspection apparatus, particularly, to an inspection method and an inspection apparatus which permit suppressing the needle pressure applied by a probe to the inspection electrode of a target object to be inspected.

2. Description of the Related Art

In the manufacturing process of semiconductor devices, these devices are formed on a semiconductor wafer. Then, inspected are the electrical characteristics of the target object(s) to be inspected (hereinafter referred to as "the device") such as a device in the state of the semiconductor wafer and a device cut away from the semiconductor wafer and packaged. In the inspection process, the device is inspected by transmitting and receiving an electric signal to and from a tester via a probe electrically in contact with the inspection electrodes of the device.

Where the inspection electrode is formed of a material that is likely to be oxidized such as aluminum, copper or a solder, an insulating film such as an oxide film is formed on the surface of the inspection electrode in the inspecting stage. Therefore, even if the probe is brought into contact with the inspection electrode, the electrical connection between the two is not stabilized. Particularly, where the inspection electrode is made of aluminum, a very hard oxide film is formed on the surface of the inspection electrode, with the result that it is very difficult to bring the probe into electrical contact with the inspection electrode.

In the prior art, the probe is brought into electrical contact with the inspection electrode by the mode shown in FIGS. 22A and 22B in accordance with the flow chart shown in FIG. 21. Specifically, the preparation for the inspection of the device is performed first (step S1), followed by bringing the probe N into contact with the inspection electrode P with a predetermined pressure, e.g., 10 to 20 g/a probe, as shown in FIG. 22A (step S2). Then, it is judged whether or not the probe N has been brought into electrical contact with the inspection electrode P (step S3). Where it is judged that electrical contact has been achieved, the inspection is started (step S4). In general, it is judged in step S3 that the probe N is not in electrical contact with the inspection electrode P by simply bringing the probe N into contact with the inspection electrode P because an insulating film O is interposed between the two. In order to overcome the difficulty, the probe N and the inspection electrode P are reciprocated relative to each other (scrubbed) as denoted by an arrow in FIG. 22B so as to scrape off the insulating film O (step S5). In this step S5, the probe N is brought into electrical contact with the inspection electrode P. After electrical contact has been confirmed, the inspection is started in step S4.

Another method of breaking the insulating film O is to sharpen the tip of the probe. In this method, it is possible to increase the planar pressure given by the probe to the inspection electrode, making it possible to permit the probe to be stuck into the inspection electrode so as to ensure a good electrical contact between the two. In this case, it is necessary to stick the tip of the probe into the inspection electrode by at least 2,000 to 4,000 Å in order to ensure electrical contact.

Recently, proposed is a probe card having fine probes each having a diameter of scores of microns formed in a silicon substrate with a small pitch by using, for example, micro machine processing technology. Since the probe card has a micro structure, it is possible for the probe card to cope with a high speed signal. In addition, since the probe is formed on a silicon substrate, the probe card is advantageous in that it eliminates the effects caused by the difference in the thermal expansion coefficients of the probe card and the device in the heating test.

BRIEF SUMMARY OF THE INVENTION

In the method of scraping off the insulating film, it is possible for the scraped dust of the insulating film to attach to the probe N, which impairs conduction. Therefore, it is not guaranteed that electrical contact between the probe and the inspection electrode can be ensured by the method described above. Further, the life of the probe N is shortened by the scrubbing and the yield of the manufactured device is lowered because the inspection electrode P is scratched as shown in FIG. 22B. It should be noted that the contact point between the probe N and the inspection electrode P set in advance at the optimum position is altered by the scrubbing. It has also been found that the device is contaminated with the scraped dust scattered from the insulating film O, as shown in FIG. 22B. Such being the situation, it is necessary to periodically remove the scraped dust of the insulating film from the probe N, leading to a reduction in the inspection efficiency.

In the method in which the tip of the probe is stuck into the inspection electrode, the damage done to the inspection electrode is small. However, the inspection electrode is scratched as in the method described above. Also required is the durability for maintaining the shape of the tip portion of the probe. Since the degree of integration of the devices has been markedly enhanced in recent years, the miniaturization of the device and the thinning of the film have been drastically progressed. Under the circumstances, the thickness of the inspection electrode has been decreased such that, if the probe is stuck until the probe is brought into electrical contact with the inspection electrode, the underlying layer of the inspection electrode also tends to be damaged.

The probe card manufactured by utilizing the micro machine processing technology has a fine probe structure, with the result that it is difficult to apply a high needle pressure to the probe.

The present invention has been achieved in an attempt to overcome at least one of the above-noted problems inherent in the prior art.

An object of an aspect of the present invention is to provide an inspection method and an inspection apparatus, which permit markedly decreasing the needle pressure applied by the probe to the measuring electrode.

Another object of an aspect of the present invention is to provide an inspection method and an inspection apparatus, which permit suppressing the damage done to the inspection electrode and which also prolong the life of the probe when used repeatedly.

Still another object of an aspect of the present invention is to provide an inspection method and an inspection apparatus which reduce the necessity of applying a cleaning treatment to the probe so as to improve the inspecting efficiency.

Additional objects and advantages of an aspect of the present invention will be set forth in the description which follows, and in part will be obvious from the description, or may be learned by practice of the present invention. The objects and advantages of the present invention may be realized and obtained by means of the instrumentalities and combinations particularly pointed out hereinafter.

According to a first aspect of the present invention, there is provided a method of inspecting a target object to be inspected, comprising the steps of:

bringing about a fritting phenomenon in a part of the insulating film formed on the inspection electrode of the target object to be inspected so as to break a part of the insulating film;

bringing an inspecting probe into electrical contact with the surface of a part of the inspection electrode, the insulating film of the part of the inspection electrode having been broken by the fritting phenomenon; and inspecting the electrical characteristics of the target object by using a tester connected to the inspecting probe.

It is desirable for the step of breaking a part of the insulating film included in the inspection method described above to comprise the steps of:

bringing a probe into contact with the inspection electrode of the target object to be inspected; and applying a voltage between the probe and the inspection electrode so as to bring about the fritting phenomenon in the insulating film formed on the surface of the inspection electrode.

It is also desirable for the step of breaking a part of the insulating film comprises the steps of:

bringing a first probe and a second probe into contact with the inspection electrode of the target object; and applying a voltage between the first probe and the second probe so as to bring about the fritting phenomenon in the insulating film formed on the surface of the inspection electrode.

It is desirable for the inspection method described above to further comprise the step of inspecting the electrical characteristics of the target object to be inspected by utilizing, as the inspection electrode, at least one of the first probe and the second probe in contact with the surface of a part of the inspection electrode, the insulating film of the part having been broken by the fritting phenomenon which has been brought about within the insulating film.

In the inspection method of the present invention, it is desirable for the step of inspecting the electrical characteristics of the target object to be inspected by utilizing at least one of the first probe and the second probe as the inspecting probe to comprise the step of electrically disconnecting the probe not utilized as the inspecting probe, from at least one of the tester and the inspection electrode.

In the inspection method of the present invention, it is desirable for the step of electrically disconnecting the probe from the inspection electrode to comprise the step of electrically separating the probe not utilized as an inspecting probe from the inspection electrode.

In the inspection method of the present invention, it is desirable for the separating step to be performed by utilizing at least one of a piezo element, a bimetal, and an electrostatic element.

According to a second aspect of the present invention, there is provided an inspection apparatus of a target object to be inspected, comprising:

a power source circuit for applying a voltage to a part of the insulating film formed on the inspection electrode of the target object so as to form a predetermined potential gradient in at least a part of the insulating film, a fritting phenomenon being formed in the insulating film by the predetermined potential gradient so as to break a part of the insulating film;

an inspecting probe that is brought into electrical contact with the surface of a part of the inspection electrode, the insulating film of the part of the inspection electrode having been broken by the fritting phenomenon; and a tester connected to the inspecting probe so as to inspect the electrical characteristics of the target object to be inspected.

It is desirable for the inspection apparatus to further comprise a current limiter for limiting the current flowing between the probe and the inspection electrode.

In the inspection apparatus of the present invention, it is desirable for the current limiter to form a predetermined potential gradient in at least a part of the insulating film to comprise:

a first probe and a second probe each brought into contact with the inspection electrode of the target object to be inspected; and a power source circuit for applying a voltage between the first probe and the second probe, the voltage serving to bring about a fritting phenomenon in the insulating film formed on the surface of the inspection electrode.

In the inspection apparatus of the present invention, it is desirable for at least one of the first probe and the second probe to be formed of at least one material selected from the group consisting of tungsten, palladium and a beryllium-copper alloy.

It is desirable for the inspection apparatus of the present invention to further comprise a controller for controlling the power source circuit, and a communication circuit for connecting the control means to the tester.

In the inspection apparatus of the present invention, it is desirable for the means for forming a predetermined potential gradient in at least a part of the insulating film to be incorporated in the tester.

In the inspection apparatus of the present invention, it is desirable for the current limiter for limiting the current flowing between the probe and the inspection electrode to be incorporated in the tester.

In the inspection apparatus of the present invention, it is desirable for the power source circuit for forming a predetermined potential gradient in at least a part of the insulating film to comprise:

a first probe and a second probe, which are brought into contact with the inspection electrode of the target object to be inspected; and a power source circuit for applying a voltage between the first probe and the second probe, the voltage serving to bring about a fritting phenomenon in the insulating film formed on the surface of the inspection electrode.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 4A–4B shows how the inspecting probe is brought into electrical contact with the inspection electrode by the fritting phenomenon by using the inspection apparatus shown in FIG. 2, wherein FIG. 4A shows the state that an inspecting probe and a fritting probe are brought into contact with an inspection electrode and a voltage is applied between the inspecting probe and the fritting probe, and FIG. 4B shows the state that the inspecting probe is brought into electrical contact with the inspection electrode by the fritting phenomenon;

FIG. 21 is a flow chart showing the conventional inspection method; and

FIGS. 22A–22B shows how the probe is brought into electrical contact with the inspection electrode by the conventional inspection method, wherein FIG. 22A shows the state that the probe is brought into contact with the inspection electrode, and FIG. 22B shows the state that the probe is brought into electrical contact with the inspection electrode by scrubbing.

DETAILED DESCRIPTION OF THE INVENTION

FIGS. 1 to 5 collectively show a first embodiment of the present invention. In the inspection method of the embodiment, a part of the insulating film such as an oxide film formed on the surface of the inspection electrode of the device is broken by utilizing a fritting phenomenon. In the embodiment, the probe is brought into electrical contact with the inspection electrode in the portion where the insulating film is broken. It is possible to lower the needle pressure between the probe and the inspection electrode to a level lower than the present level of the needle pressure, i.e., the needle pressure can be lowered to, for example, 0.1 g or less, by utilizing the fritting phenomenon. As a result, the inspection electrode is not scratched so as to prolong the life of the probe. The fritting phenomenon denotes the phenomenon that, if a voltage is applied to the insulating film such as an oxide film formed on the surface of a metal, i.e., the inspection electrode in the embodiment, in a manner to form a potential gradient of about 105 to 106 V/cm, the insulating film is subjected to insulation breakdown because of the nonuniformity in the thickness of the insulating film or in the composition of the metal so as to form a current path.

Figure 1:
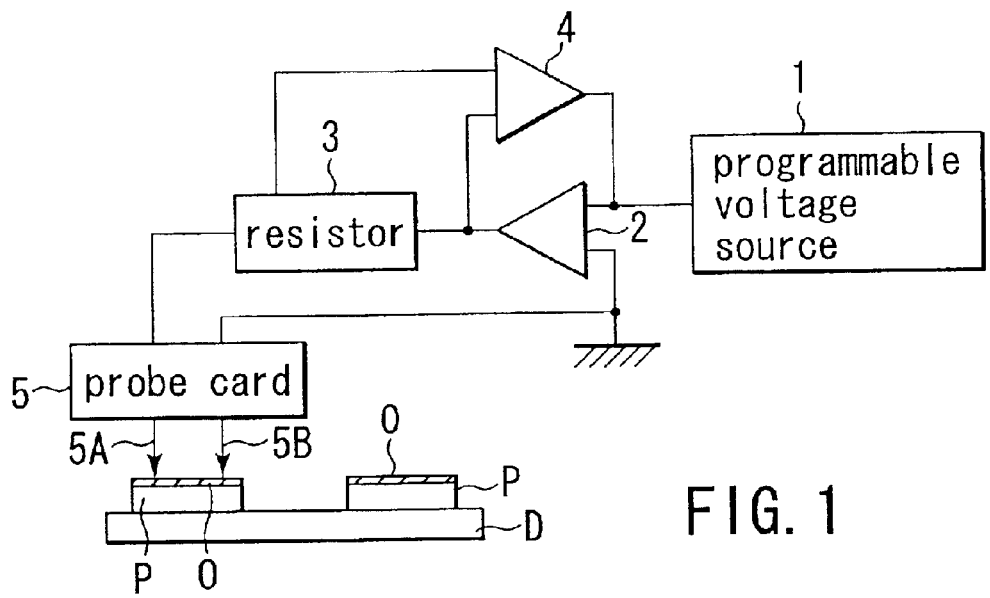
FIG. 1 shows the principle of a fritting apparatus used in the inspection method of an embodiment of the present invention.

FIG. 1 shows the principle of a devised fritting apparatus used in the embodiment for bringing about a fritting phenomenon. As shown in FIG. 1, the fritting apparatus comprises a power source (ex. a programmable voltage source) 1, a voltage-applied buffer amplifier 2, a resistor 3 and an applied current limiter 4. The programmable voltage source 1 applies voltage to a first probe 5A and a second probe 5B of a probe card 5. The first probe 5A is connected to the voltage-applied buffer amplifier 2 via the resistor 3, and the second probe 5B is connected to the input terminal of the voltage-applied buffer amplifier 2 and to the ground. It is desirable for each of these first and second probes 5A and 5B to be made of a conductive metal such as tungsten (W), a beryllium-copper alloy (BeCu) or palladium (Pd).

The fritting apparatus of the construction described above is operated as follows. Specifically, the first and second probes 5A and 5B of the probe card 5 are brought into contact with the inspection electrode P of a device D with a low needle pressure, e.g., 0.1 g or less. Under this condition, a voltage is applied from the programmable voltage source 1 to the first probe 5A through the voltage-applied buffer amplifier 2 and the resistor 3. Where the insulating film O is very thin, a slight tunnel current flows in the initial stage. The potential gradient between the first and second probes 5A and 5B is gradually increased by gradually increasing the voltage from the programmable voltage source 1 so as to reach a predetermined potential gradient of about 105 to 106 V/cm. As a result, the insulating film O positioned below the first probe 5A and the second probe 5B is broken so as to bring the first probe 5A and the second probe 5B into contact with the metal surface of the inspection electrode so as to rapidly increase the current flowing between the first probe 5A and the second probe 5B. The applied current limiter 4 detects the current so as to cause the voltage-applied buffer amplifier 2 to cease to apply voltage such that a further current does not flow. As a result, the first and second probes 5A and 5B are brought into electrical contact with the inspection electrode P so as to make it possible to inspect the electrical characteristics of the device D.

Figure 2:
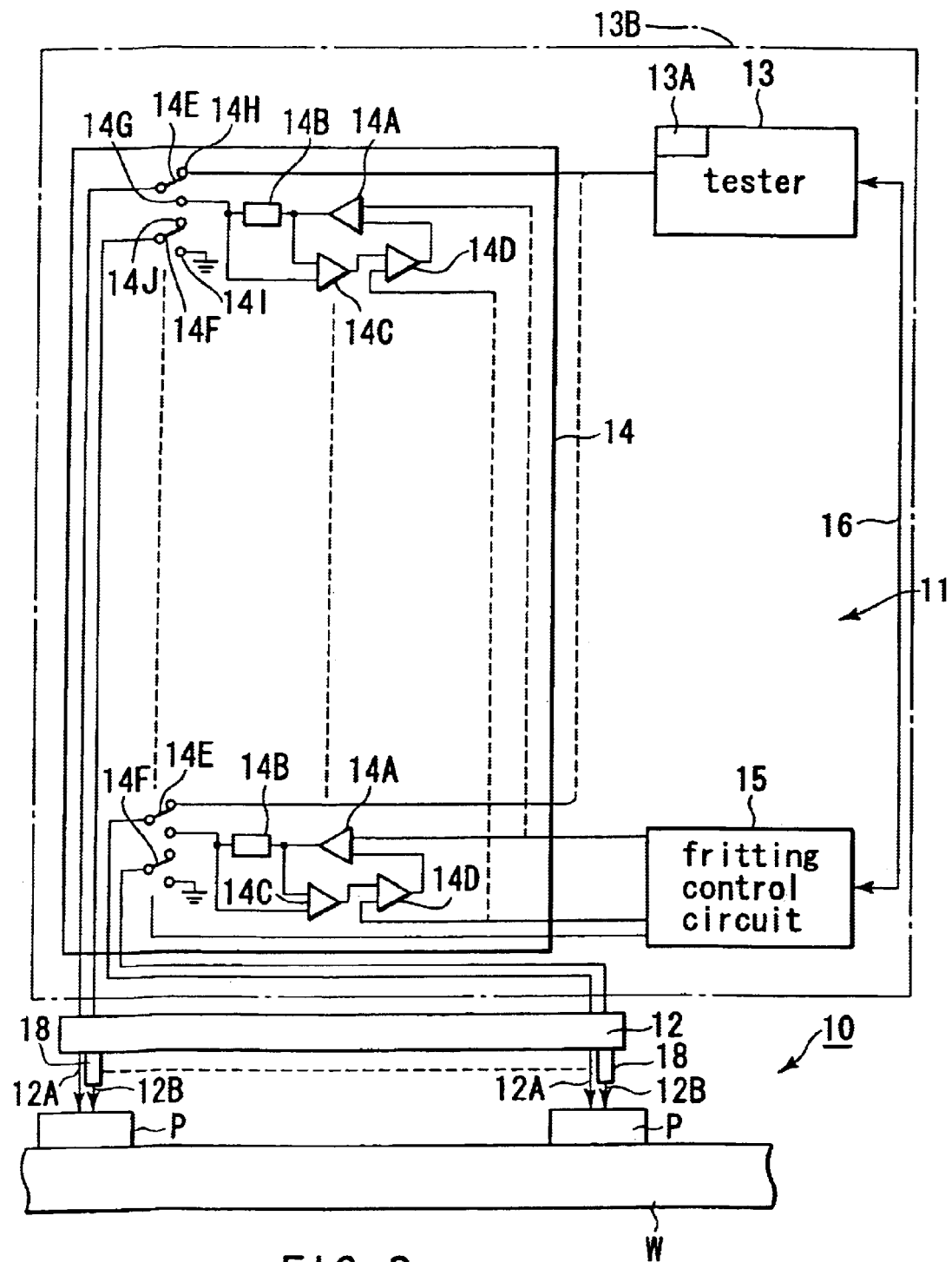
FIG. 2 shows the construction of an inspection apparatus according to one embodiment of the present invention, to which is applied the principle shown in FIG. 1.

FIG. 2 shows the construction of an inspection apparatus 10 according to the first embodiment of the present invention, in which is employed the principle of the fritting apparatus shown in FIG. 1. The inspection apparatus 10 according to the first embodiment of the present invention comprises a fritting apparatus 11 and a probe card 12, as shown in FIG. 2. The inspection apparatus 10 is connected so as to communicate with a tester 13 with power source 13A. On the other hand, the flitting apparatus 11 comprises a flitting circuit 14 serving to realize the fritting phenomenon and a flitting control circuit 15 serving to control the fritting circuit 14. The flitting control circuit 15 is connected to the tester 13 through a general purpose communication circuit 16 such as an RS or a GPIB. The probe card 12 is provided with a pair of first and second probes 12A and 12B, which are collectively brought into contact with an inspection electrode P arranged on the target object to be inspected. It is possible for the number of pairs of the first and second probes 12A, 12B to be equal to the number of inspection electrodes P of the target objects (devices) to be inspected. If a number n of inspection electrodes P are formed on a single device, it is possible to mount a number n of pairs of the first and second probes 12A and 12B on the probe card 12. The second probe 12B is used only when the insulating film O is broken by the fritting phenomenon. Therefore, in the following description, the first probe 12A is called an inspecting probe 12A and the second probe 12B is called a fritting probe 12B.

The power source circuit 13B may be considered as including the power source 13A, the flitting circuit 14, and the flitting control circuit 15, all of which can supply power a pair of first and second probes 12A and 12B.

The fritting circuit 14 comprises a number n of circuits each consisting of an applied voltage buffer amplifier 14A, a resistor 14B, a current detection amplifier 14C, a current limiting amplifier 14D, and relay switches 14E and 14F. The number n corresponds to the number of pairs of the inspecting probe 12A and the fritting probe 12B. The fritting control circuit 15 serves to relay-control the relay switches 14E and 14F. The relay switch 14E serves to switch the inspecting probe 12A between a contact 14G connected to the fritting apparatus 11 and a contact 14H connected to the tester 13. On the other hand, the relay switch 14F performs the switching function between a ground potential point 14I and a floating contact 14J. The inspecting probe 12A is connected to the relay switch 14E, and the fritting probe 12B is connected to the relay switch 14F. The high frequency characteristics can be improved by connecting the relay switch 14F of the fritting probe 12B to a point as close to the probe as possible. After the insulating film O has been broken by the fritting phenomenon, it is desirable for the fritting probe 12B to be disconnected from the tester. To achieve this particular state, it is possible to employ a mechanism for disconnecting the wiring or a mechanism 18 for moving upward the fritting probe 12B so as to move the fritting probe 12B away from the inspection electrode. The mechanism 18 for moving the fritting probe 12B away from the inspection electrode may be formed of, for example, a piezo element, a bimetal or an electrostatic element.

Figure 3:
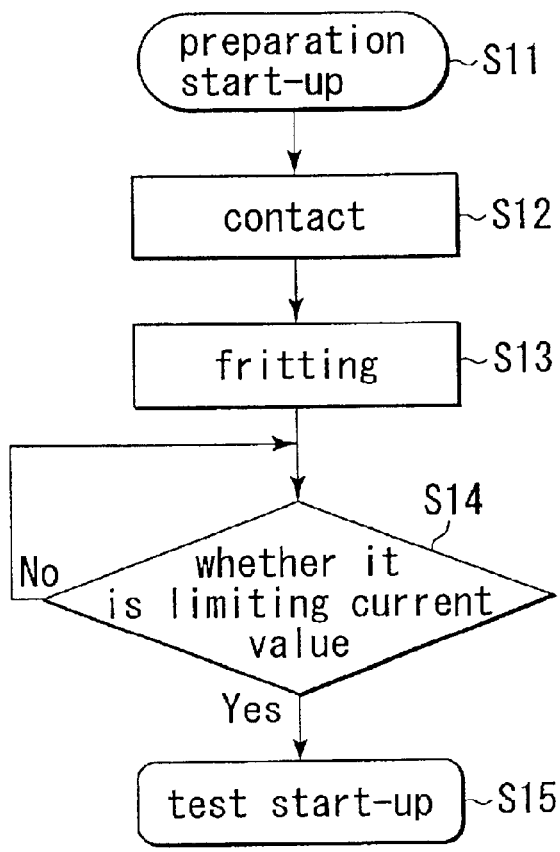
FIG. 3 is a flow chart showing an inspection method according to one embodiment of the present invention.
Figure 4A:
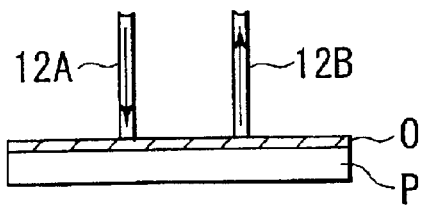
Figure 4B:
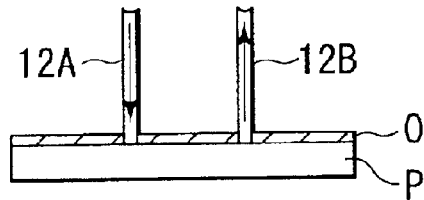

The inspection method according to an embodiment of the present invention, which is performed by using the inspection apparatus 10 described above, will now be described with reference to FIGS. 3, 4A and 4B. In the first step, the positions of the inspecting probe 12A and the fritting probe 12B are aligned with the position of the inspection electrode P of the device D (step S11). These probes 12A and 12B are brought into contact with each inspection electrode P of the device D with a low needle pressure, e.g., 0.1 g or less, as shown in FIG. 4A (step S12). In this step, the relay switch 14E is switched to contact 14G via the fritting control circuit 15, with the result that the inspecting probe 12A is connected to the fritting apparatus 11. Then, the relay switch 14F is switched to the ground contact 14I so as to be grounded. In this fashion, the probe card 12 is connected to the fritting apparatus 11.

The fritting operation is started by the voltage application from the fritting control circuit 15 to the inspecting probe 12A through the applied voltage buffer amplifier 14A and the resistor 14B (step S13). Where the insulating film O is very thin, a tunnel current flows in the direction denoted by an arrow in FIG. 4A in the initial stage of the voltage application. The tunnel current is a very small current, far smaller than the limiting current value. It is possible to determine the limiting current value by the resistance value of the probes 12A and 12B in contact with the inspection electrode, as shown in FIG. 4B. The limiting current valve is determined when the resistance valve is lower than 1 Ω, or preferably, lower than 0.5 Ω in the case where the probes 12A and 12B are in contact with the inspection electrode, as shown in FIG. 4B. The very small current is detected by the current detecting amplifier 14C via the resistor 14B. The detected value is supplied to the current limiting amplifier 14D. A limiting current is supplied as a reference current from the fritting control circuit 15 to the current limiting amplifier 14D. The current limiting amplifier 14D compares the detected current value generated from the current detection amplifier 14C with the limiting current value (reference current value) generated from the fritting limiting circuit 15 so as to judge whether or not the detected current value has reached the limiting current (step S14). While the applied voltage from the fritting control circuit 15 is gradually elevated, the current limiting amplifier 14D judges whether or not the current of the current sense resistor 14B has reached the limiting current.

The electric potential gradient between the inspecting probe 12A and the fritting probe 12B is gradually increased by gradually increasing the applied voltage from the voltage buffer amplifier 14A. If the electric potential gradient is increased to a level at which the fritting phenomenon is brought about, the insulating film O on the surface of the inspection electrode P is broken by the fritting phenomenon as shown in FIG. 4B. When the detected current of the current detecting amplifier 14C is rapidly increased to reach the limiting current, the voltage application from the applied voltage buffer amplifier 14A through the current limiting amplifier 14D is stopped by the fritting phenomenon. At this stage, the inspecting probe 12A and the fritting probe 12B are brought into electrical contact with the inspection electrode P so as to form the state under which the inspection can be performed. Under this state, the relay switch 14E is successively switched from the contact 14G connected to the fritting apparatus 11 to the contact 14H connected to the tester 13 under the control performed by the fritting control circuit 15. Also, the relay switch 14F is successively switched from the ground contact 14I to the floating contact 14J in synchronism with the switching of the relay switch 14E. As a result, the inspecting probe 12A is connected to the tester 13 so as to cause the fritting probe 12B to float electrically. Under this state, the fritting control circuit 15 notifies the tester 13 through the general purpose communication circuit 16 that the state under which the inspection can be performed has been formed. The tester 13 supplies an inspecting signal to the inspecting probe 12A so as to inspect the electrical characteristics of the target object to be inspected (stage S15).

As described above, according to the first embodiment of the present invention, the insulating film O of the inspection electrode P is broken under the state that the inspecting probe 12A is brought into contact with the inspection electrode P with a low needle pressure. As a result, the inspecting probe 12A is brought into electrical contact with the inspection electrode P so as to make it possible to perform the inspection of the electrical characteristics of the target object to be inspected without fail. Since the inspecting probe 12A is brought into electrical contact with the inspection electrode P with a very low needle pressure of 0.1 g, it is possible to improve the yield of the target object to be inspected without damaging the inspection electrode P so as to prolong the life of the inspecting probe 12A. Since the inspection can be performed with the needle pressure of the inspecting probe 12A set at 0.1 g or less, the inspection can be performed without fail even if the probe construction is simple such that the probe is formed by, for example, erecting a bonding wire. According to the first embodiment of the present invention, the peeling dust is not generated from the inspection electrode P, with the result that the target object to be inspected is not contaminated with the peeling dust of the inspection electrode, and the peeling dust is not attached to the inspecting probe 12A. As a result, the yield is further improved. In addition, it is unnecessary to apply a cleaning treatment to the inspecting probe 12A so as to increase the inspecting efficiency.

Figure 5:
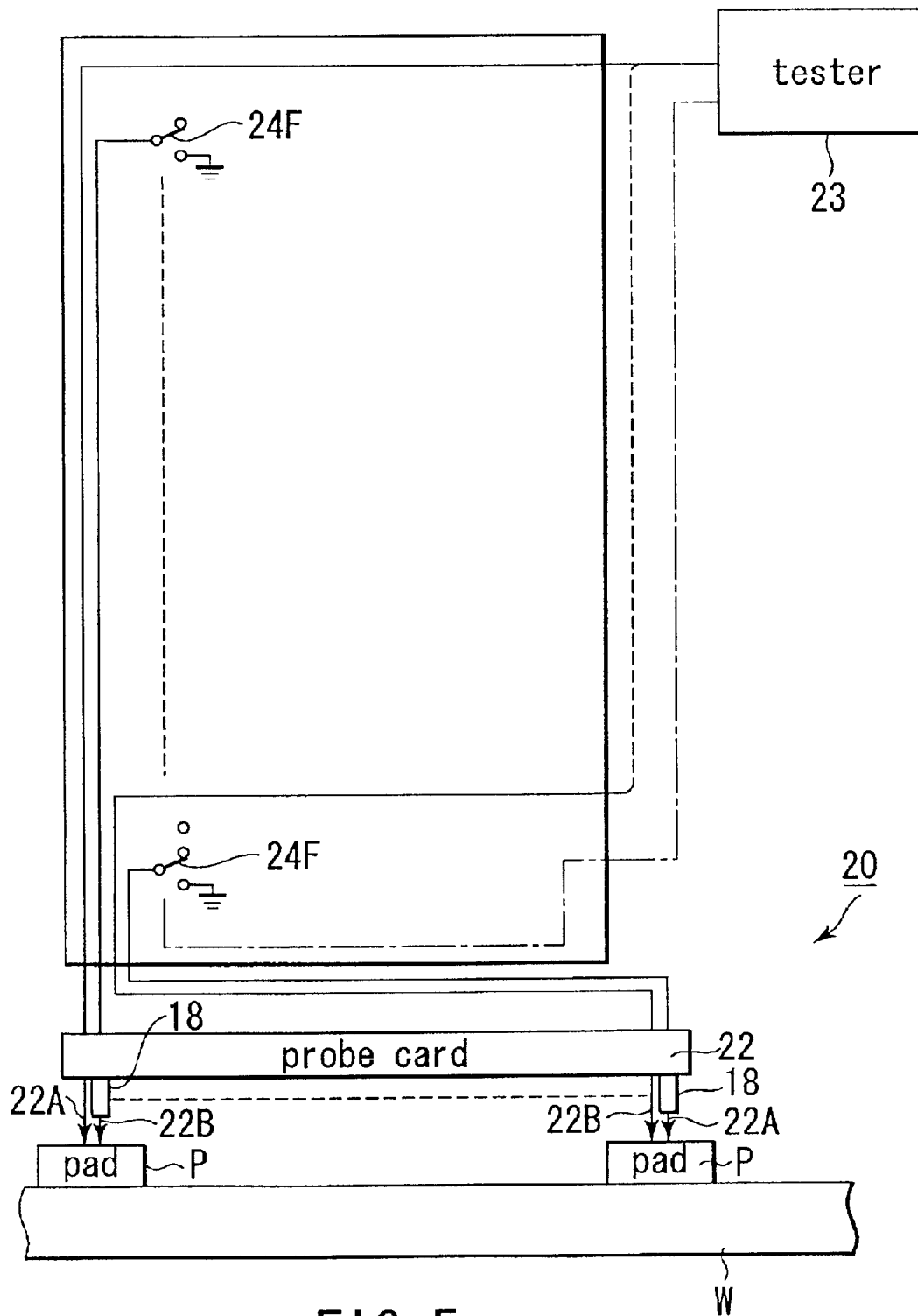
FIG. 5 shows the construction of an inspection apparatus according to another embodiment of the present invention.

According to the first embodiment of the present invention, the needle pressure applied to the inspecting probe 12A is low so as to increase the degree of freedom in the construction of the needle tip and the beam. Also, it is possible to ensure a large amount of overdriving movement of the inspecting probe 12A from the contact starting position. It is also possible to decrease the length of the beam for obtaining the same needle pressure so as to make it possible to arrange the probes in a high density. Further, since the stability of the contact is unlikely to be affected by the shape of the needle tip of the inspecting probe 12A, it is unnecessary to process the needle tip in a special shape such as a pyramidal shape.

Where the driver of the tester can be used as the flitting power source, it may suffice to mount a circuit for the relay 24F for connecting the flitting probe 12B to the ground as shown in FIG. 5. In other words, the inspecting probe 22A may be connected to the voltage power source (not shown) of the tester 23. The flitting probe 22B may be connected to the relay switch 24F. It is possible to use the I/O driver within the tester 23 for the control of the relay switch 24F. Whether or not the flitting can be performed by using the tester 23 depends on the power source current capacity of the tester 23. In terms of the software, it may suffice to add a program for the fritting to the program of the tester 23. Also, in terms of the hardware, it may suffice to add a relay circuit. Alternatively, it is possible for the tester itself to be provided with a fritting power source, the fritting circuit 14 and the fritting control circuit 15. These embodiments also produce the function and the effect similar to those produced by the embodiment shown in FIG. 2.

Figure 6:
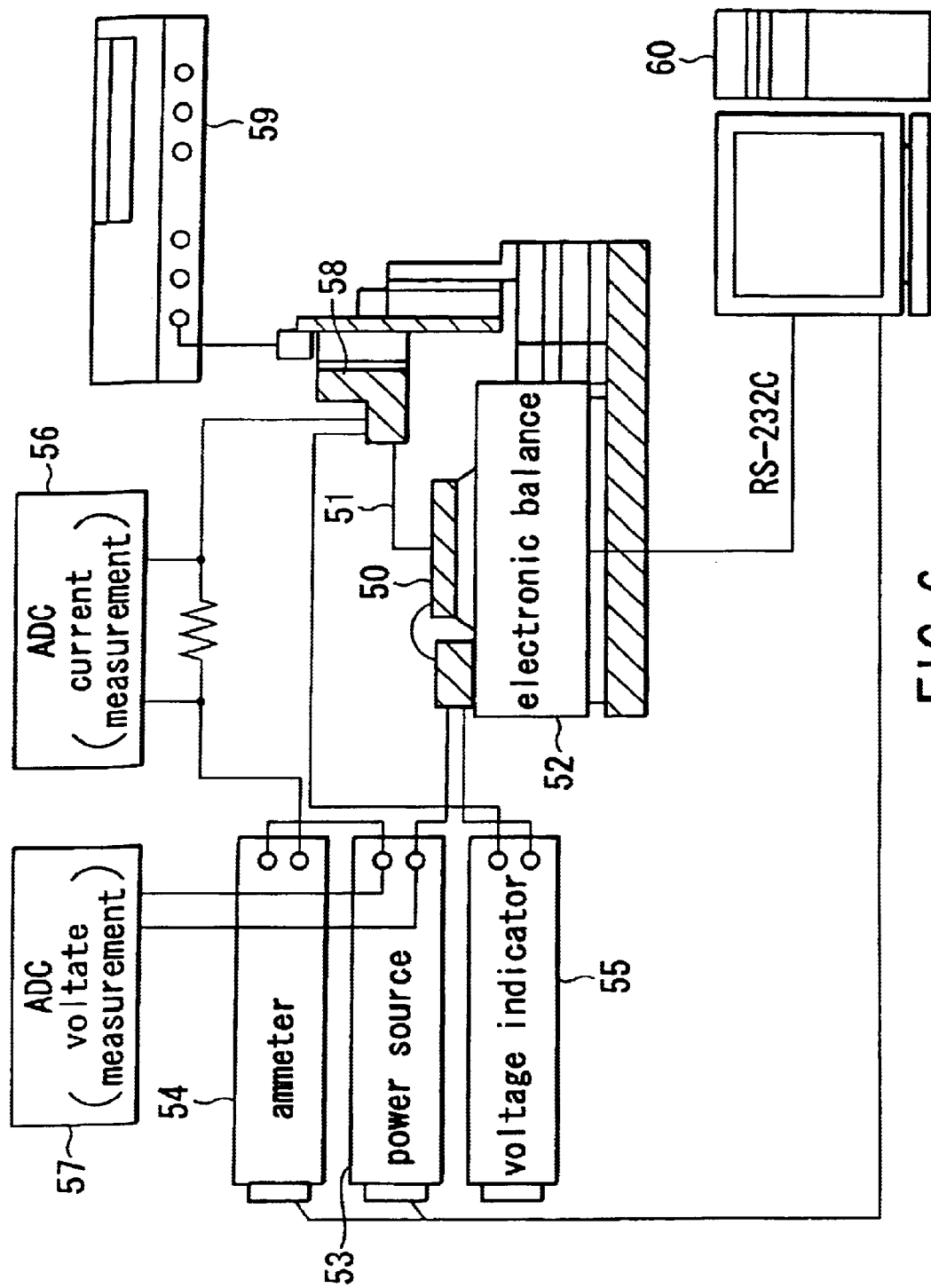
FIG. 6 shows the construction of a measuring apparatus for verifying the fritting phenomenon.

The relationship between the material used for forming the probe and the fritting characteristics has been verified by using a measuring apparatus shown in FIG. 6. The results of the verification are shown in FIGS. 7 to 18.

FIG. 6 shows the construction of the measuring apparatus used in this embodiment. The load (needle pressure) between a probe 51 and a wafer 50 was measured by an electronic balance 52. The current and the voltage applied by a power source 53 were measured by using an ammeter 54 and a voltage indicator 55. For measuring the waveform of the fritting, an A/D converters 56 and 57 was utilized. The current and the power source voltage were measured and recorded. For the control of the probe 51 in the Z-direction, a piezo stage 58 having a maximum displacement of 100 μm was used. The piezo stage 58 was operated via a piezo driver 59. All of the electronic balance 52, the power source 53, the ammeter 54, the voltage indicator 55, the A/D converters 56, 57 and the piezo stage 58 were connected to a computer 60 via a communication circuit (GPIB, RS-232C). The control of the applied voltage and the stage position was performed via the computer 60, and the results of the measurement were recorded one by one. A loop of the voltage control, the voltage measurement, and the current measurement was performed repeatedly. A rate of the loop was about 10 times/sec. The measurement under high frequency was performed by using the A/D converters 56 and 57 so as to measure the power source current flowing through the A/D converters 56 and 57, respectively, and the power source voltage. The converted values from the A/D converters 56 and 57 were corrected by obtaining the relationship between the these converted values and the measured values of the ammeter 54 and the voltage indicator 55 and by using the measured values of the ammeter 54 and the voltage indicator 55.

The measurement was performed under the measuring conditions given below in accordance with the procedures (1) to (6) given below:

(1) The probe 51 was allowed to approach the wafer w by driving the piezo stage 58. The needle pressure in this stage was monitored via the electronic balance 52. The piezo stage 58 was stopped when the needle pressure exceeded a set needle pressure. The needle pressure in this stage was determined as the contact load.

(2) A voltage was applied stepwise from the power source 53 so as to generate a current and voltage. Immediately before application of the voltage, the A/D converters 56 and 57 were started and the converted values were recorded. The situation before and after application of the stepwise voltage was recorded in the memory of the A/D converters 56 and 57.

(3) If a current not lower than 1 mA was recognized after the voltage application, it was considered that fritting had taken place. If the current was not recognized, the applied voltage was returned to zero, and the measurement given in item (2) above was performed again with the voltage set twice as high as before.

(4) After the occurrence of the fritting phenomenon, the voltage was measured by setting the current at 1 mA. The resistance value calculated from the measured voltage was determined as the contact resistance.

(5) After the applied voltage was returned to zero volts, the probe 51 was moved away from the measuring electrode by driving the piezo stage 58. It was considered that the minimum value of the load measured at this stage was the separating force.

(6) The measurements of items (1) to (5) given above were repeated by changing the contact position.

[Measuring Conditions]

(a) Voltage Control Mode (S)
   Set voltage: 30 V, 5 V
   Setting of current limiter: 10 mA, 100 mA, 250 mA
   Needle pressure: 0.1 g, 0.02 g, 0.005 g, 0.001 g
(b) Current Control Mode (1)
   Set current: 10 mA, 100 mA, 250 mA
   Needle pressure: 0.1 g, 0.02 g, 0.005 g, 0.001 g
(c) Probe Material:
   Tungsten (W), beryllium-copper alloy (BeCu), palladium (Pd)
(d) Electrode: aluminum (Al)

1. Waveform at Fritting Time

Figure 7:
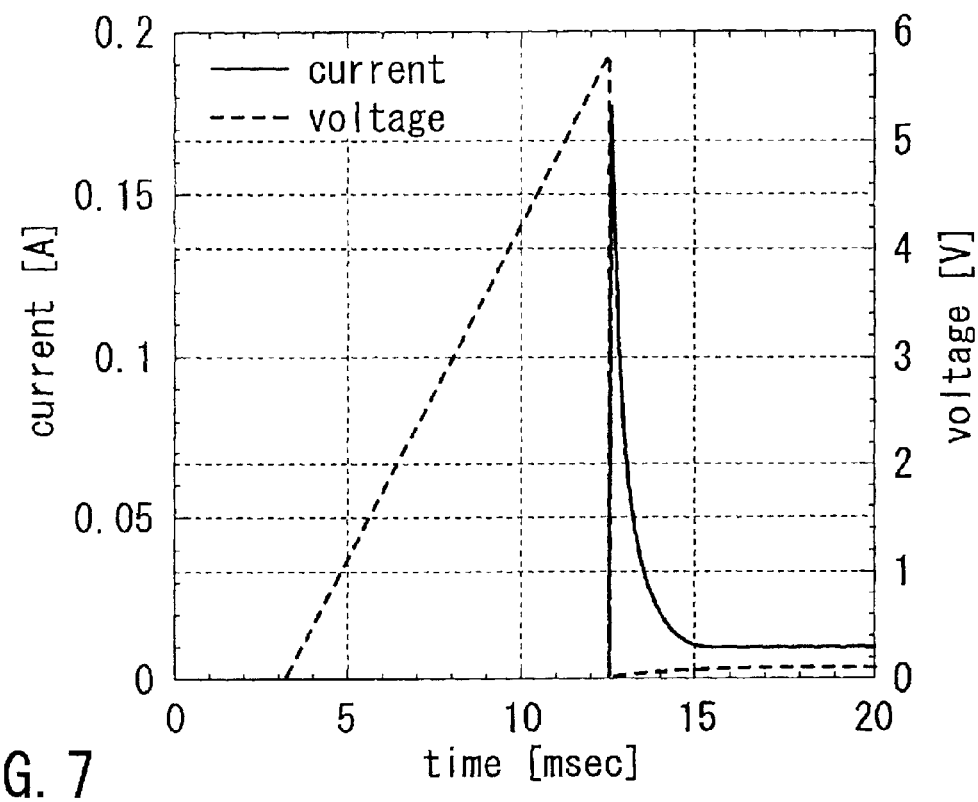
FIG. 7 is a graph showing the waveforms of the current and the voltage exhibiting a typical fritting phenomenon.
Figure 8:
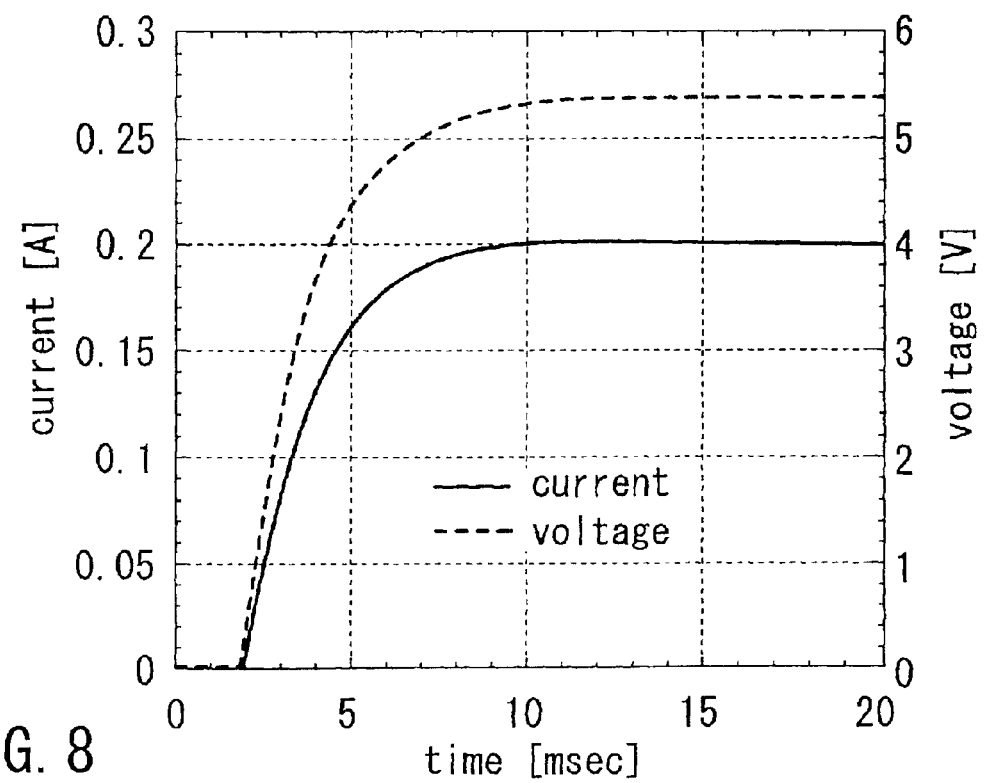
FIG. 8 is a graph showing the waveforms of the current and the voltage when the insulating film is mechanically broken.
Figure 9:
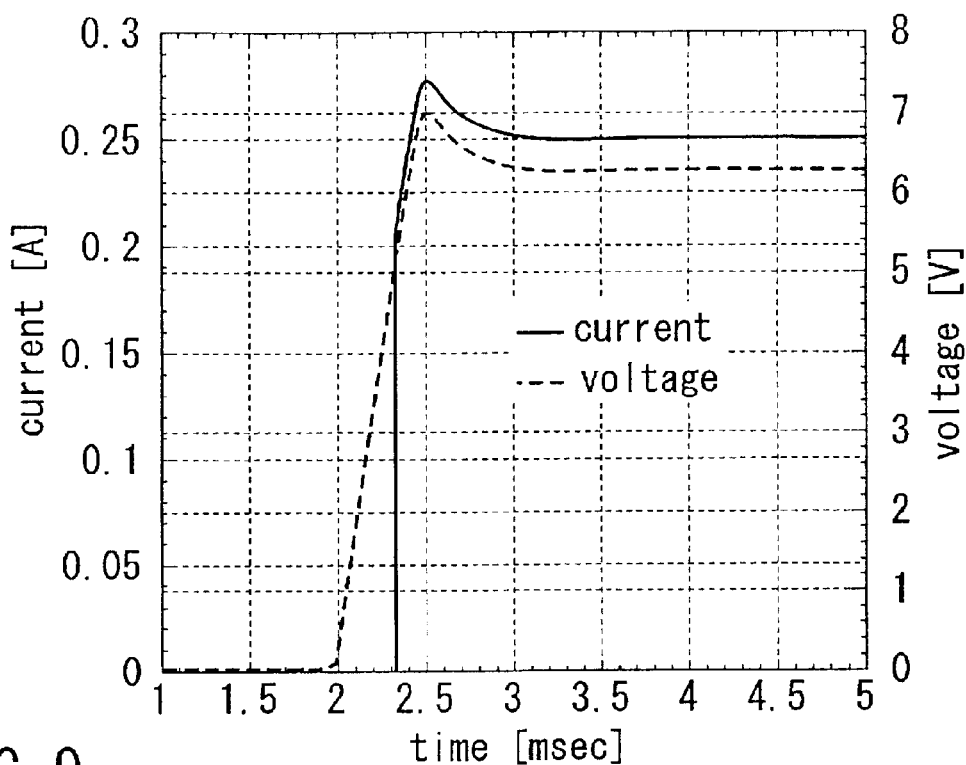
FIG. 9 is a graph showing the waveforms of the current and the voltage when the current in the fritting stage has not yet reached a limit value.

Changes with time in the voltage and current were measured by using a tungsten probe, covering the cases where the needle pressure, the limiting current and the set voltage were changed in various fashions. The waveforms of the voltage and the current before and after the fritting were measured so as to obtain waveforms of three typical patterns as shown in FIGS. 7 to 9.

The current and the voltage were measured by using the A/D converters 56 and 57 under the condition that the current was controlled by setting the limiting current at 10 mA by using a tungsten probe under a needle pressure of 0.01 g. FIG. 7 is a graph showing the waveforms of the current denoted by a solid line and the voltage denoted by the broken line at the time when the fritting took place. The graph shows the typical waveform in the event of the fritting phenomenon. As shown in the graph of FIG. 7, the fritting phenomenon takes place when the voltage has reached a fritting voltage at which an insulation breakdown is brought about so as to cause the current to flow and the resistance to be lowered. Although the maximum value of current is set at 10 mA by the current limiter, it is seen that a large current flows for an instant, because it takes time before the current limiter is operated. To be more specific, it is seen that a voltage of 6 V is applied at the time when the current begins to flow so as to cause the current to flow in an amount exceeding 170 mA, and that the current limiter operates substantially simultaneously with the starting of the current flow so as to lower the voltage and the current to 10 mA, which is the set value of the limiting current.

The current and the voltage were measured by using the A/D converters 56 and 57 under the condition that the current was controlled by setting the limiting current at 250 mA and the voltage at 5 V by using a tungsten probe under a needle pressure of 0.1 g. FIG. 8 is a graph showing the waveforms of the current, which is denoted by a solid line, and the voltage, which is denoted by a broken line, at the time when the current began to flow. As shown in the graph, the voltage and the current change proportionally, in the case where the insulating film is broken mechanically, not electrically. The current and the voltage were measured by using the A/D converters 56 and 57 under the condition that the current was controlled by setting the limiting current at 250 mA and the voltage at 30 V by using a tungsten probe under a needle pressure of 0.02 g. FIG. 9 is a graph showing the waveforms of the current, which is denoted by a solid line, and the voltage, which is denoted by a broken line, at the time when the fritting phenomenon took place. The graph of FIG. 9 shows that the voltage and the current are increased in proportion after occurrence of the fritting phenomenon because the current in the fritting time did not reach the limiting current, and that the voltage and the current are rendered constant at the time when the limiting current is reached.

2. Relationship Between Needle Pressure and Fritting Voltage

Figure 10:
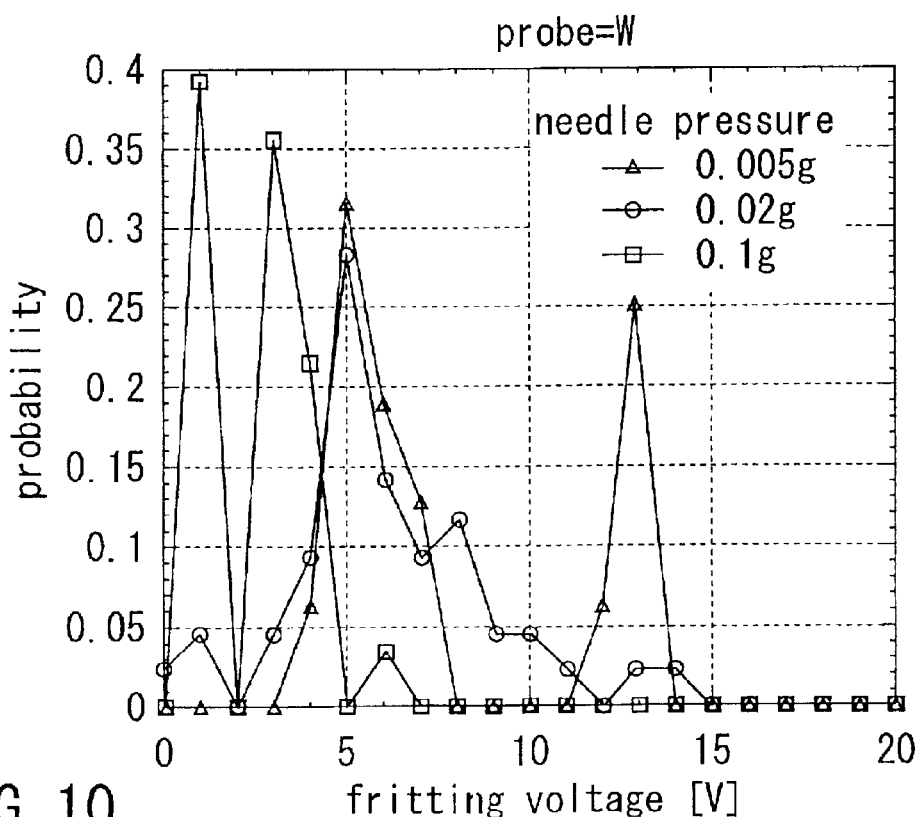
FIG. 10 is a graph showing the relationship between the needle pressure of the w (tungsten) probe and the fritting voltage.
Figure 11:
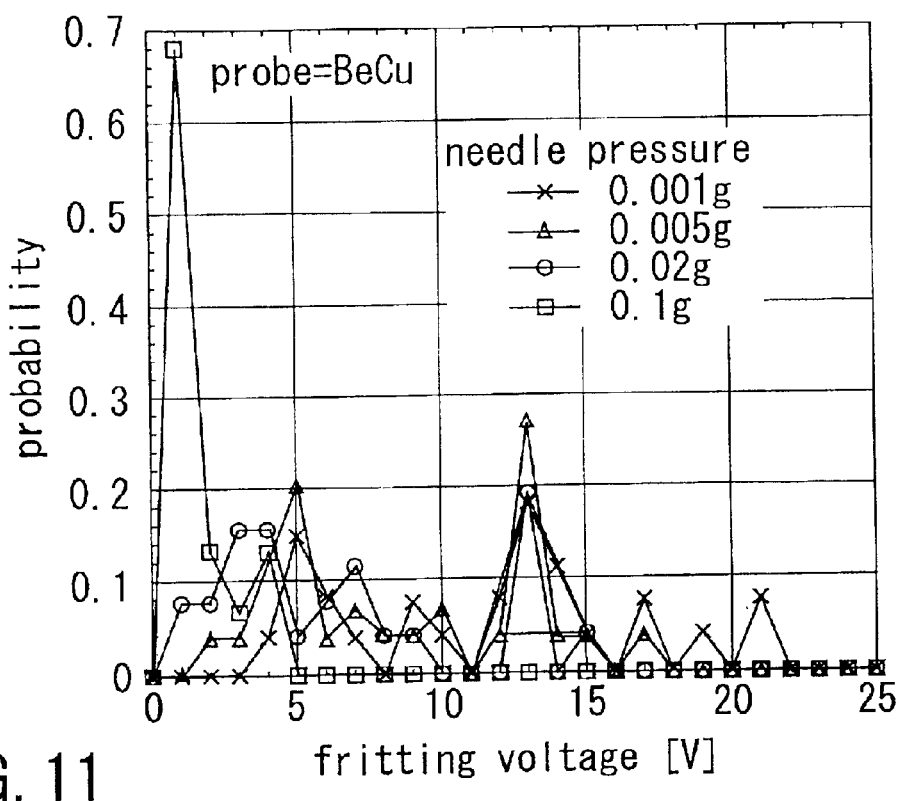
FIG. 11 is a graph showing the relationship between the needle pressure of a BeCu probe and the fritting voltage.
Figure 12:
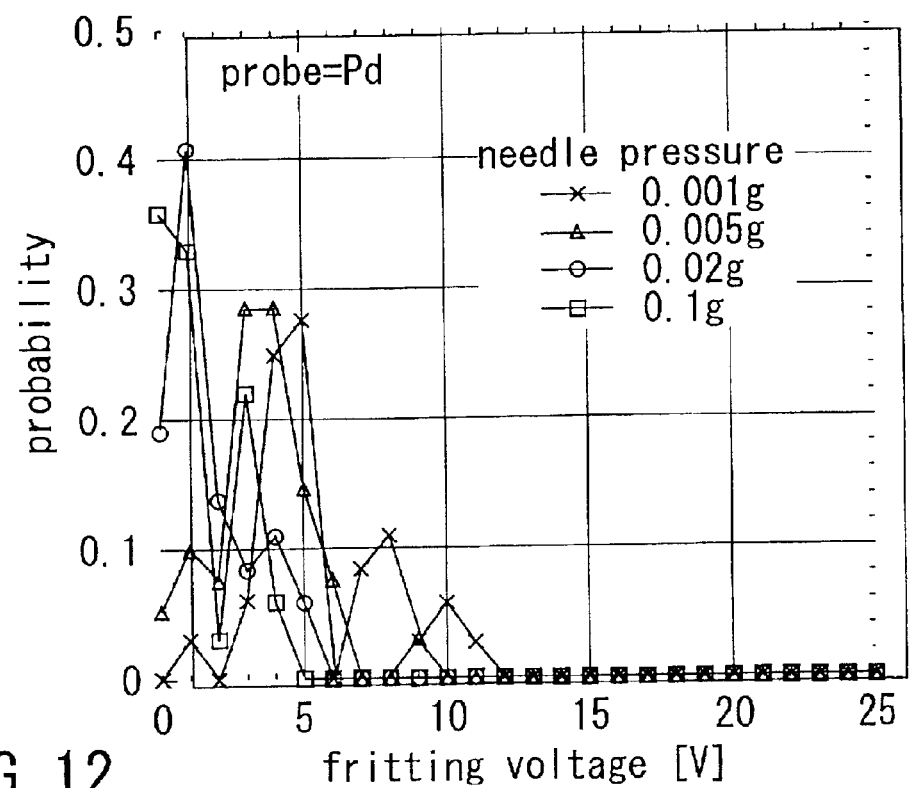
FIG. 12 is a graph showing the relationship between the needle pressure of a Pd probe and the fritting voltage.

The term "fritting voltage" denotes the voltage value at the time when the current briefly exceeded 1 mA for the first time. The probe used was formed of W, BeCu or Pd. Each of FIGS. 10 to 12 are graphs showing the relationship between the needle pressure of the probe and the fritting voltage. In the graphs of FIGS. 10 to 12, the probability with the total value set at 1 is plotted on the ordinate. The distribution of the fritting voltage in the case of using the W probe, the BeCu probe and the Pd probe is classified by the needle pressure. A needle pressure of 0.001 g (marked by x), 0.005 g (marked by Δ), 0.02 g (marked by ○) and 0.1 g (marked by □) was applied to each probe. FIG. 10 illustrates the case where the W probe was used, FIG. 11 illustrates the case where the BeCu probe was used, and FIG. 12 illustrates the case where the Pd probe was used.

As is apparent from FIGS. 10 to 12, the fritting voltage is distributed in two points of around 13 V and around 5 V in the case where the needle pressure is low. With an increase in the needle pressure, the peak voltage is generally shifted toward the lower voltage and, at the same time, a peak appears in a point not higher than 1 V. If the needle pressure is increased to 0.1 g, a peak not lower than 13 V is eliminated, and the current begins to flow even at a voltage less than 1 V. Also, it appears that the peak at 5 V is shifted to the point of about 3 V.

The experimental data suggests the situations given below:

(1) There are two kinds of insulating film.

A voltage of about 5 V is required for breaking one of these insulating films, and a voltage of about 8 V (=13 V–5 V) is required for the breakage of the other insulating film. There are cases where the latter insulating film is present and where the latter insulating film is not present.

(2) If the needle pressure is increased, the probability of the fritting phenomenon occurrence under a low voltage is increased. Under the needle pressure of 0.1 g, an insulating film exhibiting a breakdown voltage of 8 V does not exist. If the needle pressure is increased, a peak appears under the voltage of 1 V. It is considered reasonable to understand that the peak appearance is not due to the insulation breakdown but due to the mechanical breakdown.

(3) The insulating film is considered to be formed of an oxide film of aluminum, an oxide film of a probe material or a contaminated layer of water, etc.

(4) It is considered reasonable to understand that, if the needle pressure is set at 0.1 g, a fritting phenomenon is brought about substantially without fail under a voltage not higher than 5 V.

3. The Relationship Between Maximum Current and Contact Resistance.

Figure 13:
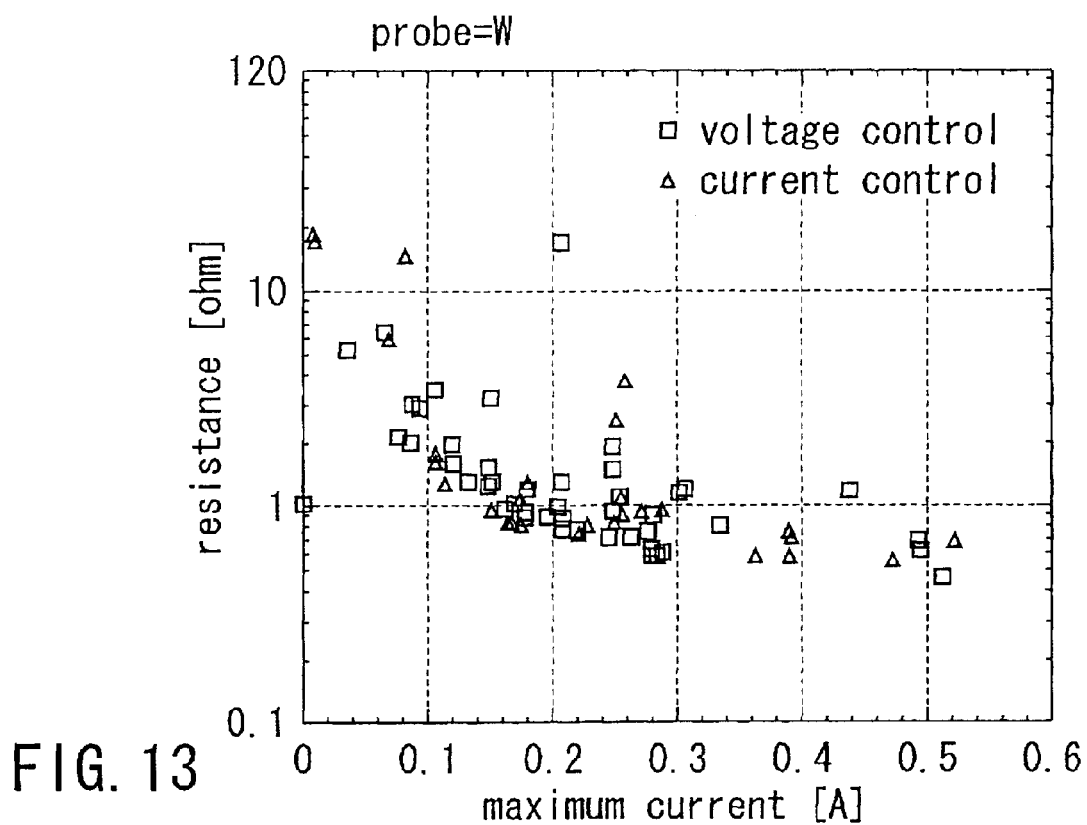
FIG. 13 is a graph showing the relationship between the maximum current of the W (tungsten) probe and the contact resistance.
Figure 14:
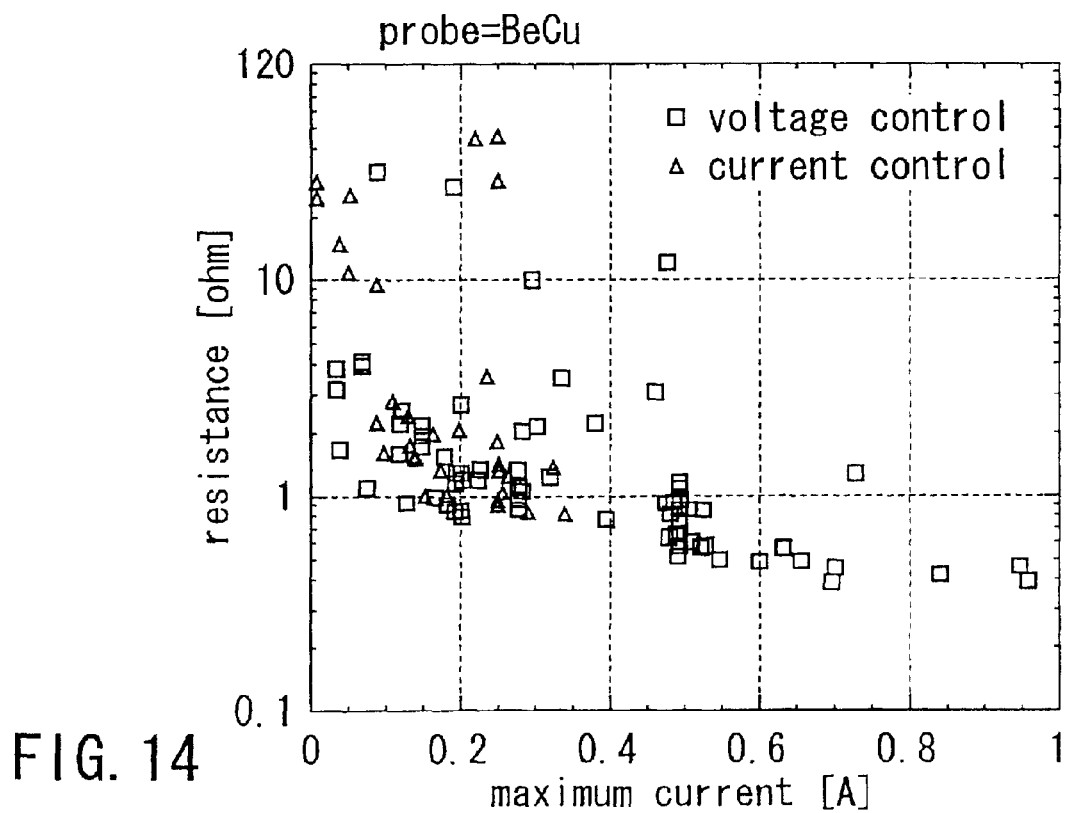
FIG. 14 is a graph showing the relationship between the maximum current of a BeCu probe and the contact resistance.
Figure 15:
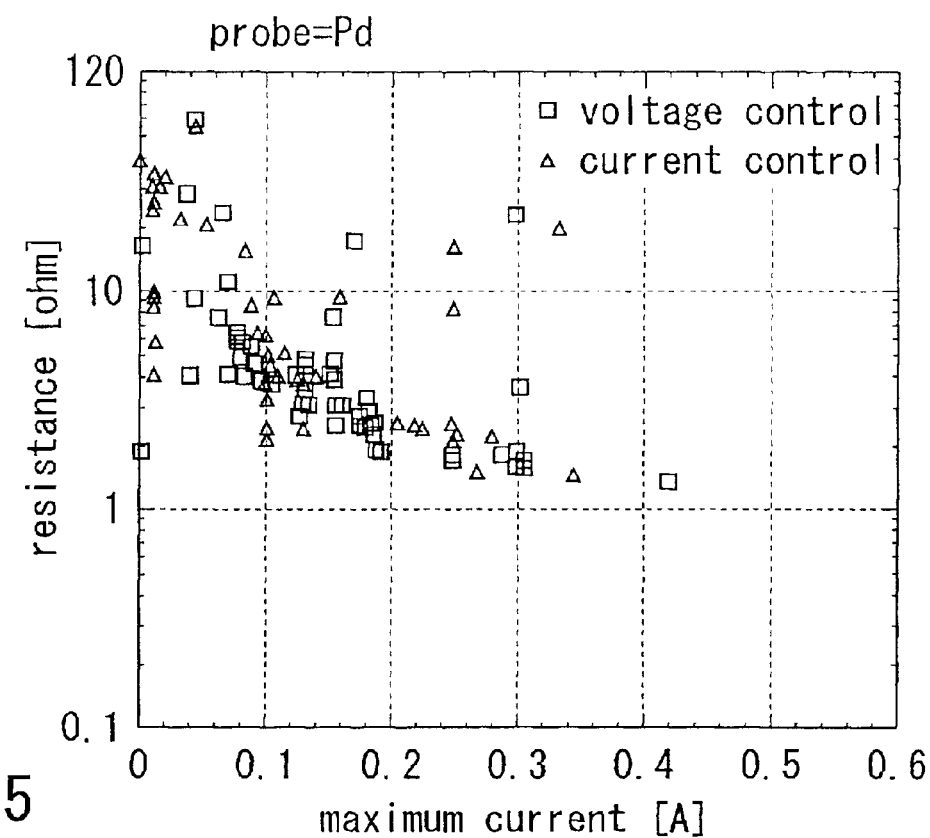
FIG. 15 is a graph showing the relationship between the maximum current of a Pd probe and the contact resistance.

The maximum current and the contact resistance at the fritting time were measured by using a W probe, a BeCu probe and a Pd probe, with the results as shown in the graphs of FIGS. 13 to 15. Specifically, FIGS. 13 to 15 are graphs showing the relationship between the maximum current and the contact resistance in the cases of using a W probe, a BeCu probe and a Pd probe, respectively. The term "maximum current" denotes the maximum value of the current flowing the instant the fritting phenomenon took place. Also, the term "contact resistance" denotes the contact resistance value when the current is set at 1 mA after the fritting phenomenon. In each graph, the mark □ denotes the result of the measurement by the voltage controlled mode, with the mark Δ denoting the result of the measurement by the current controlled mode.

In each probe, it is observed that the resistance is lowered with the increase in the current. In the case of the W probe and the BeCu probe, it is seen that the resistance is lowered to 1 Ω or less if the maximum current exceeding 0.5 A flows. Also, where the current is the same, the W probe and the BeCu probe exhibit substantially the same contact resistance value. On the other hand, the Pd probe exhibits a contact resistance value 1.5 times as much as the contact resistance value for each of the W probe and the BeCu probe. This experimental data supports the theory that the maximum current of the fritting should be increased in order to obtain a low contact resistance.

4. The Relationship Between the Fritting Voltage and the Maximum Current

Figure 16:
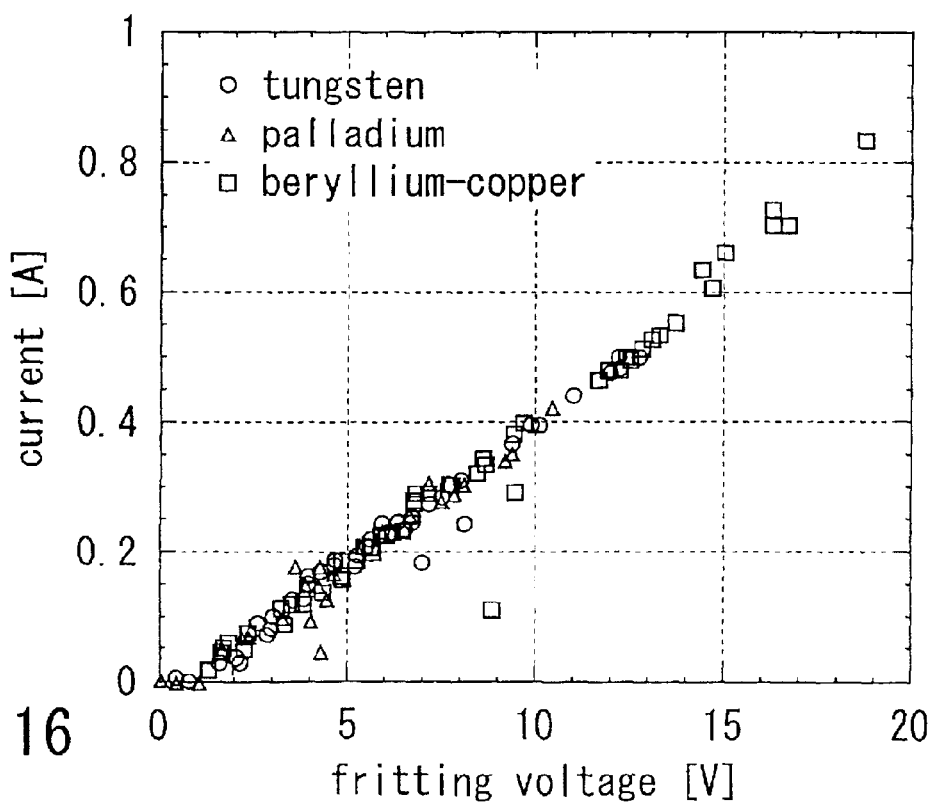
FIG. 16 is a graph showing the relationship between the fritting voltage of each of the W probe, the BeCu probe and the Pd probe and the current.
Figure 17:
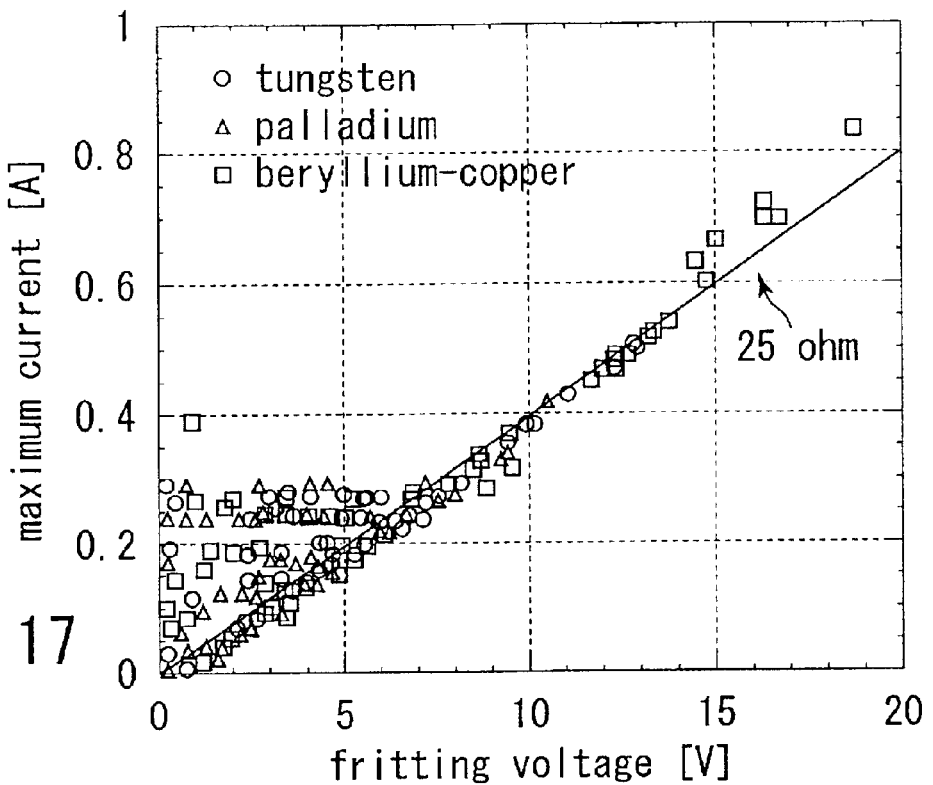
FIG. 17 is a graph showing the relationship between the fritting voltage of each of the w probe, the BeCu probe and the Pd probe and the maximum current.

FIG. 16 shows the relationship between the voltage (fritting voltage) and the current at the time of fritting (the instant the current not lower than 1 mA is detected). The plot in this case was on the line of 25 Ω, which was coincident with the circuit resistance. FIG. 17 shows the relationship between the fritting voltage and the maximum current. According to FIG. 17, when the current flowing in the fritting time, i.e., the current shown in FIG. 16, is smaller than the limiting current, the current continues to increase after the fritting to reach the limiting current (see FIG. 9). When the fritting voltage is high, the current, at the instant of fritting, constitutes the maximum current. In this embodiment, the maximum current was 300 mA in view of the capacity of the power source. It is considered reasonable to understand that it is possible to stably obtain the contact resistance not higher than 1 Ω as shown in FIGS. 13 to 15 in the case of using a power source capable of flowing current not lower than 500 mA.

In order to control the voltage applied to the contact portion at the time of fritting, an experiment was conducted in which the probe was brought into contact with the electrode with the voltage set constant. Where a voltage of 30 V was applied, it was possible to flow the current far exceeding the current limiter at the instant of fritting. The results of the experiment, which are not shown in the drawing, were found to conform well with the results shown in FIGS. 13 to 15, supporting the theory that the contact resistance can be lowered with an increase in the maximum current.

5. Relationship Between Contact Resistance and Separating Force

Figure 18:
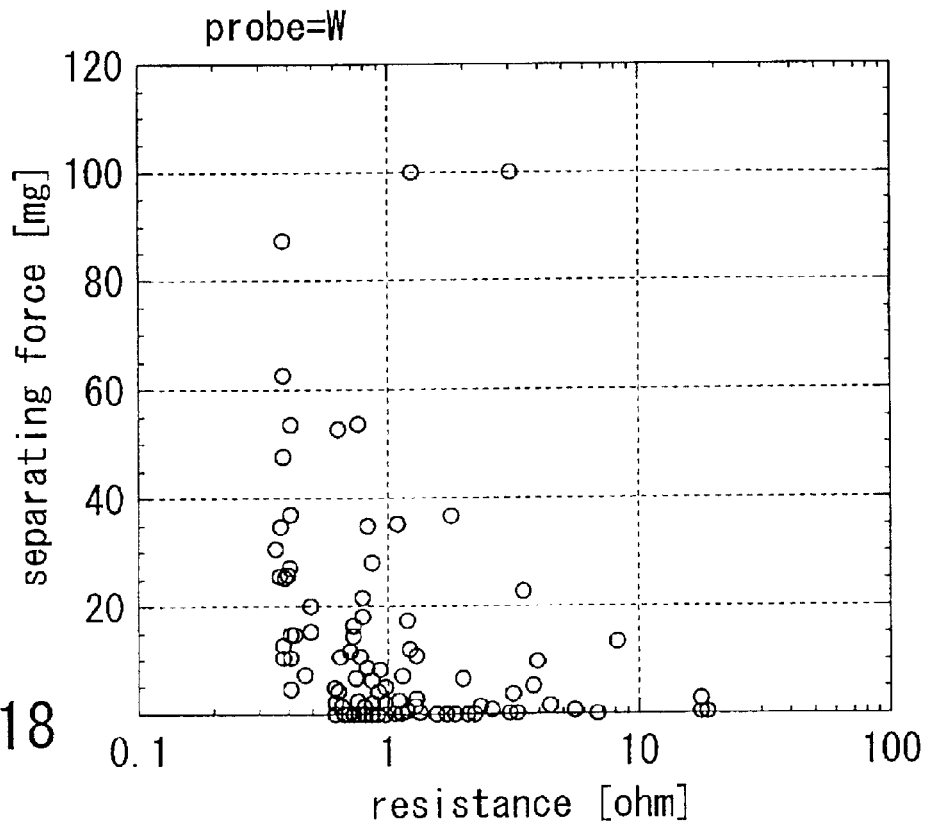
FIG. 18 is a graph showing the relationship between the contact resistance between the W probe and the electrode after the fritting and separating force.
Figure 19:
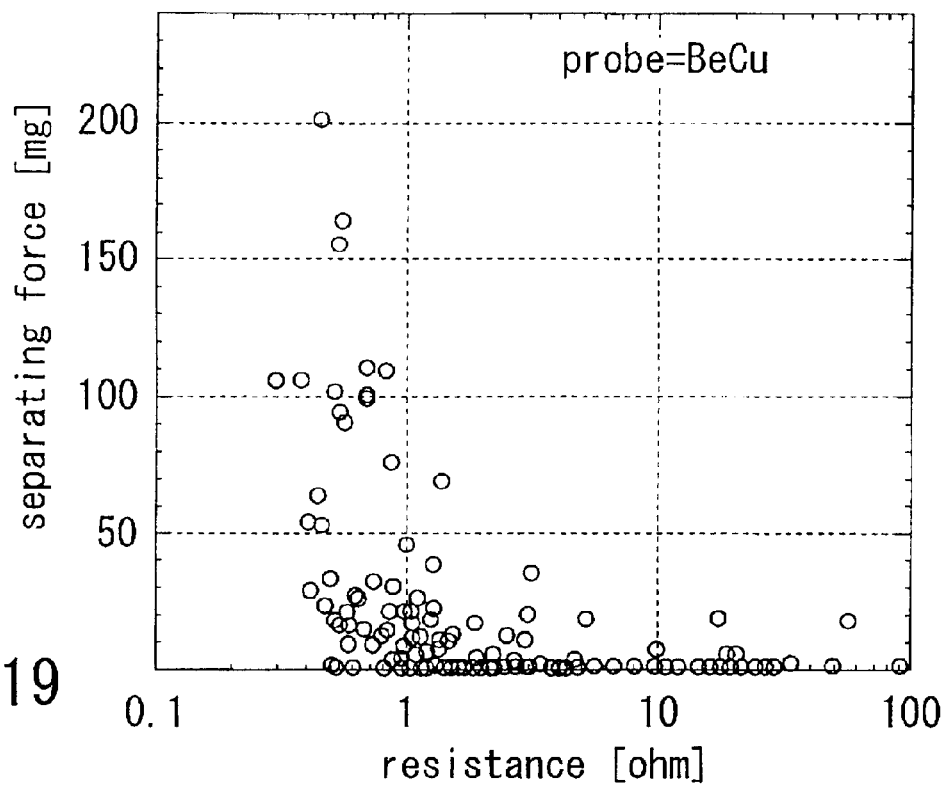
FIG. 19 is a graph showing the relationship between the contact resistance between the BeCu probe and the electrode after the fritting and the separating force.
Figure 20:
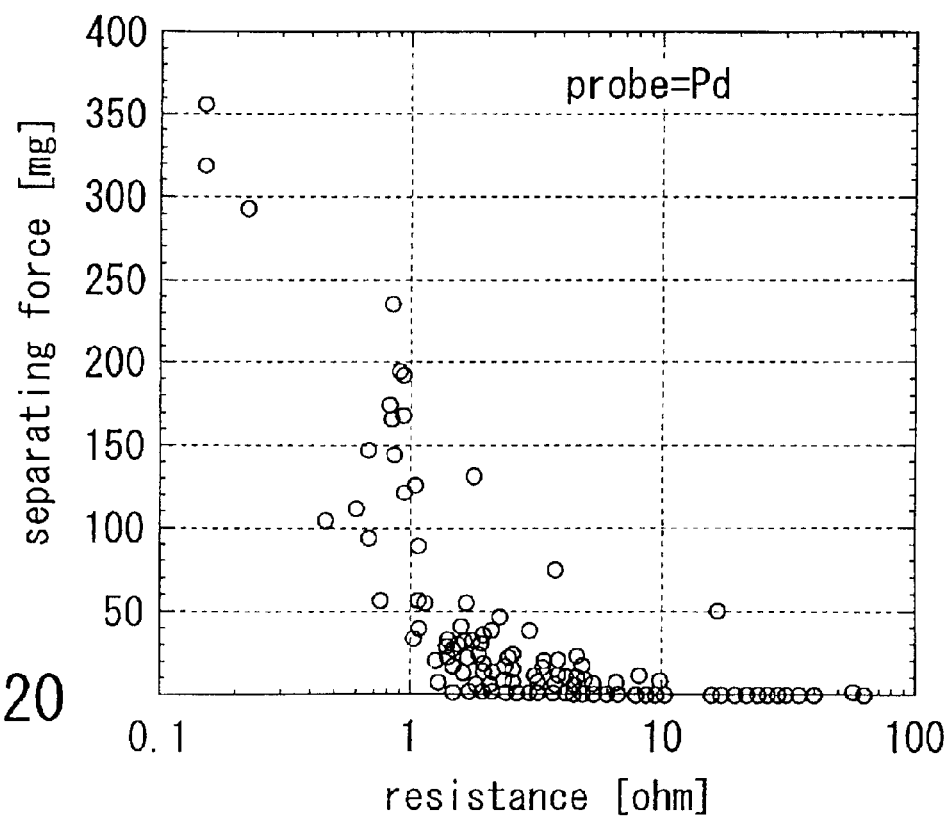
FIG. 20 is a graph showing the relationship between the contact resistance between the Pd probe and the electrode after the fritting and the separating force.

Measured was the separating force when the probe was moved away from the electrode, with the results as shown in FIGS. 18 to 20. FIG. 18 covers the case of using a W probe, FIG. 19 covers the case of using a BeCu probe, and FIG. 20 covers the case of using a Pd probe. The experimental data given in FIGS. 18 to 20 support that the separating force is small when the contact resistance is high. It has been found that the separating force is increased with a decrease in the contact resistance. It is considered reasonable to understand that the separating force is related to the area of the true contact portion. Since metals are bonded to each other in the true contact portion, it is considered reasonable to understand that the separating force between the metal members is proportional to the area and that, if the contact area is increased, the contact resistance is decreased. Under the same contact resistance, the Pd probe has the largest separating force, and the separating force is decreased in the order of the BeCu probe and the W probe.

The present invention is not limited to each of the embodiments described above. Any apparatus having the circuit construction capable of bringing about the fritting phenomenon are included in the technical scope of the present invention. In each of the embodiments described above, the needle pressure was changed within a range of 0.001 g and 0.1 g. However, the present invention is not limited to the needle pressure falling within the range noted above. It suffices for the needle pressure to be lower than the present level of the needle pressure, i.e., 10 to 20 g/probe, and to be capable of obtaining the fritting phenomenon. In short, the needle pressure is not limited to a specified range in the present invention. It has been pointed out in conjunction with the embodiments described above that the contact resistance between the probe and the electrode is lowered with the increase in the maximum current at time of fritting. However, it is possible for the current, at the time of fritting, to be low. The current is not limited to a specified range in the present invention as far as the current is capable of obtaining the fritting phenomenon.

According to the embodiments of the present invention, it is possible to markedly lower the needle pressure. According to the embodiments, it is possible to eliminate the damage done to the inspection electrode and to prolong the life of the probe when used repeatedly. Further, according to the embodiments, it is possible to provide an inspection method and an inspection apparatus, which permit eliminating the necessity for applying a cleaning treatment to the probe and which permit improving the inspecting efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of inspecting a target object to be inspected, comprising the steps of:

bringing about a fritting phenomenon using at least one probe in a part of the insulating film formed on an inspection electrode of the target object to be inspected so as to break a part of the insulating film;

bringing the at least one probe, used to brine about the fritting phenomenon, into electrical contact with the surface of a part of the inspection electrode, the insulating film of the part of the inspection electrode having been broken by the fritting phenomenon; and inspecting the electrical characteristics of the target object by using a tester connected to the at least one probe, wherein said step of breaking a part of the insulating film comprises the steps of:

bringing the at least one probe and a second probe into contact with the inspection electrode of the target object; and applying a voltage between the at least one probe and the second probe so as to bring about the fritting phenomenon in the insulating film formed on the surface of the inspection electrode, and wherein said step of inspecting the electrical characteristics of the target object to be inspected by utilizing the at least one probe further includes electrically disconnecting the second probe from the inspection electrode comprises the step of electrically by physically separating the second probe from the inspection electrode.

2. The inspection method according to claim 1, wherein said physically separating step is performed by utilizing at least one of a piezo element, a bimetal, and an electrostatic element.

3. A method of inspecting a target object to be inspected, comprising the steps of:

bringing about a fritting phenomenon using at least one probe in a part of the insulating film formed on an inspection electrode of the target object to be inspected so as to break a part of the insulating film;

bringing the at least one probe, used to bring about the fritting phenomenon, into electrical contact with the surface of a part of the inspection electrode, the insulating film of the part of the inspection electrode having been broken by the fritting phenomenon; and inspecting the electrical characteristics of the target object by using a tester connected to the at least one probe, wherein said step of breaking a part of the insulating film comprises the steps of:

bringing the at least one probe and a second probe into contact with the inspection electrode of the target object; and applying a voltage between the at least one probe and the second probe so as to bring about the fritting phenomenon in the insulating film formed on the surface of the inspection electrode, and inspecting the electrical characteristics of the target object to be inspected by utilizing the at least one probe and while the second probe remains in contact with the surface of a part of the inspection electrode, the insulating film of the part having been broken by the fritting phenomenon which has been brought about within the insulating film;

wherein said step of inspecting the electrical characteristics of the target object to be inspected by utilizing the at least one probe further comprises the step of electrically disconnecting the second probe not being used for inspecting from at least one of the tester and the inspection electrode.

* * * * *